US006876961B1

(12) United States Patent
Marshall et al.

(10) Patent No.: US 6,876,961 B1
(45) Date of Patent: Apr. 5, 2005

(54) ELECTRONIC SYSTEM MODELING USING ACTUAL AND APPROXIMATED SYSTEM PROPERTIES

(75) Inventors: John W. Marshall, Cary, NC (US); Kenneth Michael Key, Raleigh, NC (US); Scott Nellenbach, Apex, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/384,504

(22) Filed: Aug. 27, 1999

(51) Int. Cl.$^7$ .............................................. G06F 17/50
(52) U.S. Cl. .............................. 703/19; 703/2; 703/13; 703/22; 716/6; 716/7; 716/8
(58) Field of Search ............................ 703/13–22, 1–2; 716/1–16

(56) References Cited

U.S. PATENT DOCUMENTS

| | | | |
|---|---|---|---|
| 6,101,599 A | 8/2000 | Wright et al. | 712/228 |
| 6,119,215 A | 9/2000 | Key et al. | 712/19 |
| 6,144,987 A | 11/2000 | Niemi | 709/201 |
| 6,173,386 B1 | 1/2001 | Key et al. | 712/10 |
| 6,195,739 B1 | 2/2001 | Wright et al. | 712/19 |

OTHER PUBLICATIONS

Blaquiére et al, "Timing Analysis Speed–up Using a Hierarchical and a Multimode Approach," IEEE Transactions on Computer–Aided Design of Integrated Circuits and Systems, vol. 15, No. 2, pp. 244–255 (Feb. 1996).*

Luk et al, "Visualising Reconfigurable Libraries for FPGAs", IEEE Conference Record of the Thirty–First Asilomar Conference on Signals, Systems & Computers, vol. 1, pp. 389–393 (Nov. 1997).*

Li et al, "Optimization of Analog Modeling and Simulation", IEEE 5th International Conference on Solid–State and Integrated Circuit Technology, pp. 385–388 (Oct. 1998).*

McDonald et al, "Timing Analysis for the PA–8000", EE Design, Feb. 1997 (downloaded text from: www.eedesign.com/editorial/1997/coverstory9702.html).*

Shepard et al, "Design Methodology for the S/390 Parallel Enterprise Server G4 Microprocessors", IBM Journal of Research an Development, vol. 41 No. 4/5, pp. 515–547 (Jul. 1997).*

Tan et al, "Balanced Multi–Level Multi–Way Partitioning of Large Analog Circuits for Hierarchical Symbolic Analysis", IEEE Proceedings of the Asia and South Pacific Design Automation Conference, vol. 1, pp. 1–4 (Jan. 1999).*

Rodriguez–Garcia, "A Tool for Complete Small–Signal Analytical Modeling of Large Analog Circuits", IEEE Third International Workshop on Design of Mixed–Mode Integrated Circuits and Applications, pp. 36–39 (Jul. 1999).*

Kukimoto, et al., "Hierarchical Functional Timing Analysis," 35th Design Automation Conference, Jun. 1998, ACM, San Francisco, CA.

Marwan M. Hassoun, "Heirarchical Symbolic Analysis of Large Analog Circuits," Symbolic Analysis Techniques, 1998, pp. 102–139, Institute of Electrical and Electronics Engineers, Inc., New York, NY.

U.S. Appl. No. 09/106,478, filed Jun. 29, 1998, Kerr et al.
U.S. Appl. No. 09/212,314, filed Dec. 14, 1998, Scott et al.
U.S. Appl. No. 09/216,519, filed Dec. 18, 1998, Kerr et al.

(Continued)

Primary Examiner—Samuel Broda
(74) Attorney, Agent, or Firm—Cesari and McKenna, LLP

(57) ABSTRACT

A technique is provided for use in computerized modeling of an electronic system. The technique bases simulation of the system's operation (e.g., timing operation) upon both actual physical characteristics of a part of the system, and hierarchical analysis-based models of the rest of the system.

14 Claims, 6 Drawing Sheets

OTHER PUBLICATIONS

U.S. Appl. No. 09/642,144, filed Aug. 18, 2000, Key et al.
U.S. Appl. No. 09/727,068, filed Nov. 30, 2000, Wright et al.
U.S. Appl. No. 09/727,068, filed Nov. 30, 2000, Wright et al.
World Wide Web page http://www.synopsys.com/products/analysis/pt_tech_bgr.html, *Prime Time Full–Chip Static Timing Analyzer,* Jul. 12, 1999, pp. 1–17.
World Wide Web page http://www.synopsys.com/products/analysis/primtime_ds.html, *Prime Time,* Jul. 12, 1999, pp. 1–7.
World wide Web page http://www.synopsys.com/products/analysis/primtime_cs.html, *Prime Time: Full–Chip, Gate–Level Static Timing Analysis,* Jul. 12, 1999, pp. 1–2.

World Wide Web page http://www.synopsys.com/products/analysis/sta_wp.html, *Static Timing Verification: Methodology Overview,* Jul. 12, 1999, pp. 1–13.

* cited by examiner

ELECTRONIC SYSTEM MODELING USING ACTUAL AND APPROXIMATED SYSTEM PROPERTIES

CROSS-REFERENCE TO RELATED APPLICATIONS

The subject application is related to the following applications:

U.S. patent application Ser. No. 09/106,478 U.S. Pat. No. 6,513,108, Issued Jan. 28, 2003, filed Jun. 29, 1998, entitled "PROGRAMMABLE ARRAYED PROCESSING ENGINE ARCHITECTURE FOR A NETWORK SWITCH";

U.S. patent application Ser. No. 09/106,436, U.S. Pat. No. 6,195,739, Issued Feb. 27, 2001, entitled, "ARCHITECTURE FOR A PROCESSOR COMPLEX OF AN ARRAYED PIPELINED PROCESSING ENGINE," filed Jun. 29, 1998;

U.S. patent application Ser. No. 09/106,244 U.S. Pat. No. 6,101,599, Issued Aug. 8, 2000, entitled, "SYSTEM FOR CONTEXT SWITCHING BETWEEN PROCESSING ELEMENTS IN A PIPELINE OF PROCESSING ELEMENTS," filed Jun. 29, 1998;

U.S. patent application Ser. No. 09/106,246, U.S. Pat. No. 6,119,215, Issued Sep. 12, 2000, entitled, "SYNCHRONIZATION AND CONTROL SYSTEM FOR AN ARRAYED PROCESSING ENGINE," filed Jun. 29, 1998;

U.S. patent application Ser. No. 09/213,291 U.S. Pat. No. 6,173,386, Issued Jan. 9, 2001, entitled "PARALLEL PROCESSOR WITH DEBUG CAPABILITY," filed Dec. 14, 1999;

U.S. patent application Ser. No. 09/216,519, entitled "TIGHTLY COUPLED SOFTWARE PROTOCOL DECODE WITH HARDWARE DATA ENCRYPTION," filed Dec. 18, 1998; and U.S. patent application Ser. No. 09/212,314, U.S. Pat. No. 6,385,747, Issued May 7, 2002, entitled "TESTING OF REPLICATED COMPONENTS OF ELECTRONIC DEVICE," filed Dec. 14, 1998.

Each of the aforesaid copending applications is assigned to the Assignee of the subject application, and is incorporated herein by reference in its entirety.

BACKGROUND OF THE INVENTION

1. Field of the Invention

The present invention generally relates to computer modeling of electronic systems, and more specifically, to a computerized electronic system modeling and simulation technique that uses both actual and approximated/estimated properties of the system. Although the present invention will be described in connection with computer aided modeling of a portion of a parallel processor, other utilities are also contemplated for the present invention, including modeling of other types of electronic systems, and features and components thereof, and in other types of computer aided design applications.

2. Brief Description of Related Prior Art

Typically, during the process of formulating and validating a proposed electronic system design, it has been desirable to use computer aided design (CAD) techniques to model and simulate the operation of the proposed design, prior to physically fabricating the proposed system. By employing such modeling and simulation techniques, it is often possible to determine whether potential problems (i.e., design faults) are present in the proposed design, and if necessary, to modify the proposed design to reduce or eliminate such potential problems, without ever physically constructing and testing the system being designed. Thus, by employing such modeling and simulation techniques, the cost and time required to validate a proposed design may be significantly reduced.

However, it has been found that in order to meaningfully model and simulate the operation of certain systems, special considerations must be taken into account. For example, a high speed, high performance parallel processor includes a significant amount of high speed, sequential logic and other clocked circuitry whose proper operation often is critical to proper performance of the parallel processor. Therefore, at most, only minor timing faults in such circuitry can be permitted, if the system is to function acceptably. Thus, in order to meaningfully simulate the operation of a proposed parallel processor design, the timed operation of the parallel processor's clocked circuitry must be simulated with a high degree of accuracy. This need is particularly acute with respect to timing operations involving parallel processor circuit modules that are interconnected by intermodule network connections, as such network connections typically exhibit a relatively large amount of impedance and capacitance that may introduce significant propagation delays into signals traversing the network. This necessitates that the CAD system be able to determine very accurately the propagation delays of such signals.

One conventional CAD simulation technique that is able to accurately determine the propagation delay of a signal through a circuit network calculates the delay based upon the actual physical characteristics (e.g., characteristic impedances, capacitances, etc.) of the branches of the network through which the signal propagates, as well as, the actual physical characteristics of the transmitter (e.g., output impedance, charging capacitance, etc.) and intended receiver (e.g., input impedance, charging capacitance, etc.) of the signal. These actual physical characteristics may be calculated by the CAD system based upon physical design data that describe physical features of the proposed design such as the physical layout of the design's circuit paths, the physical properties of the active and passive electronic components interconnected by those paths, etc., and well known physical laws that correlate these and other features of the proposed design to the physical characteristics to be calculated.

Unfortunately, in practice, it is often difficult or impossible to employ this conventional technique to simulate the operation of certain highly complex parallel processor designs (such as those described in the aforesaid copending applications). This is because, in practice, the amount of computer processing time (hereinafter termed "processing overhead") required to accurately simulate the operation of such highly complex designs using such physical characteristics often is extremely large, and in extreme cases, can be prohibitive.

One proposed solution to this problem involves using so-called "hierarchical analysis" (HA) techniques. In HA, rather than basing the simulation of the design's timing operation upon the design's actual physical characteristics, the simulation is instead based upon approximate or estimated mathematical models of operation of portions of the design. That is, respective mathematical models are generated for respective functional blocks comprising the design which may be used to estimate the timing operation of the design. The design's timing operation is then simulated using these approximate models.

Unfortunately, although HA is able to reduce the amount of processing overhead needed to simulate a design's timing operation, it inherently introduces approximation error into such simulation. This causes timing operation simulations that are based solely upon HA-models to be inherently less accurate than timing operation simulations based upon actual physical characteristics.

This inherent inaccuracy of HA-based simulations results in certain disadvantages. For example, in order to try to ensure that the simulation uncovers all potential timing faults in the design, it may be necessary to adjust the simulation such that it is based upon worst case (i.e., most pessimistic) calculations of signal propagation delays in the design. Unfortunately, when "worst case analysis" is used, a sizable number of the timing faults identified by the simulation may actually be erroneous. This erroneous identification of timing faults may introduce significant inefficiencies into the design process. For example, a designer encountering an erroneous timing fault may believe that the fault actually is present in the design, and therefore, may unnecessarily modify the design to correct the supposed fault. This may unnecessary increase the time and expense required to formulate and validate the design.

SUMMARY OF THE INVENTION

In accordance with the present invention, an electronic system modeling technique is provided that overcomes the aforesaid and other disadvantages and drawbacks of the prior art. In broad concept, the technique of the present invention bases the simulation of the operation (e.g., timing operation) of a proposed electronic system design upon both actual physical characteristics of a portion of the design, and HA-based approximate models of the rest of the design. The portion of the design that is modeled using its actual physical characteristics may be selected so as to reduce error in the simulation to below a minimum desired threshold without increasing the amount of processing overhead needed to generate the simulation to an undesirable level.

Advantageously, when an electronic system design is modeled and its operation is simulated in accordance with the present invention, the resulting simulation may be substantially more accurate than when the design is modeled and its operation is simulated solely in accordance with conventional HA techniques. Indeed, the resulting simulation in accordance with the present invention may be sufficiently accurate to make the need to use the above-discussed type of worse case analysis unnecessary. Additionally, the amount of processing overhead required to simulate the design's operation in accordance with the present invention may be only slightly more than that required to simulate the design's operation using only conventional HA models of the design.

The aforesaid and other features and advantages of the present invention will become apparent as the following Detailed Description proceeds, and upon reference to the Drawings, wherein like numerals depict like parts, and in which:

As will be appreciated by those skilled in the art, although the following Detailed Description will proceed with reference being made to specific embodiments and methods of use, the present invention is not intended to be limited to these embodiment and methods of use. Rather, the present invention is intended to be viewed broadly as encompassing all alternatives, modifications, and variations from these embodiments and methods of use as are included within the spirit and broad scope of the hereinafter appended claims.

DETAILED DESCRIPTION OF ILLUSTRATIVE EMBODIMENTS

Figure 1:
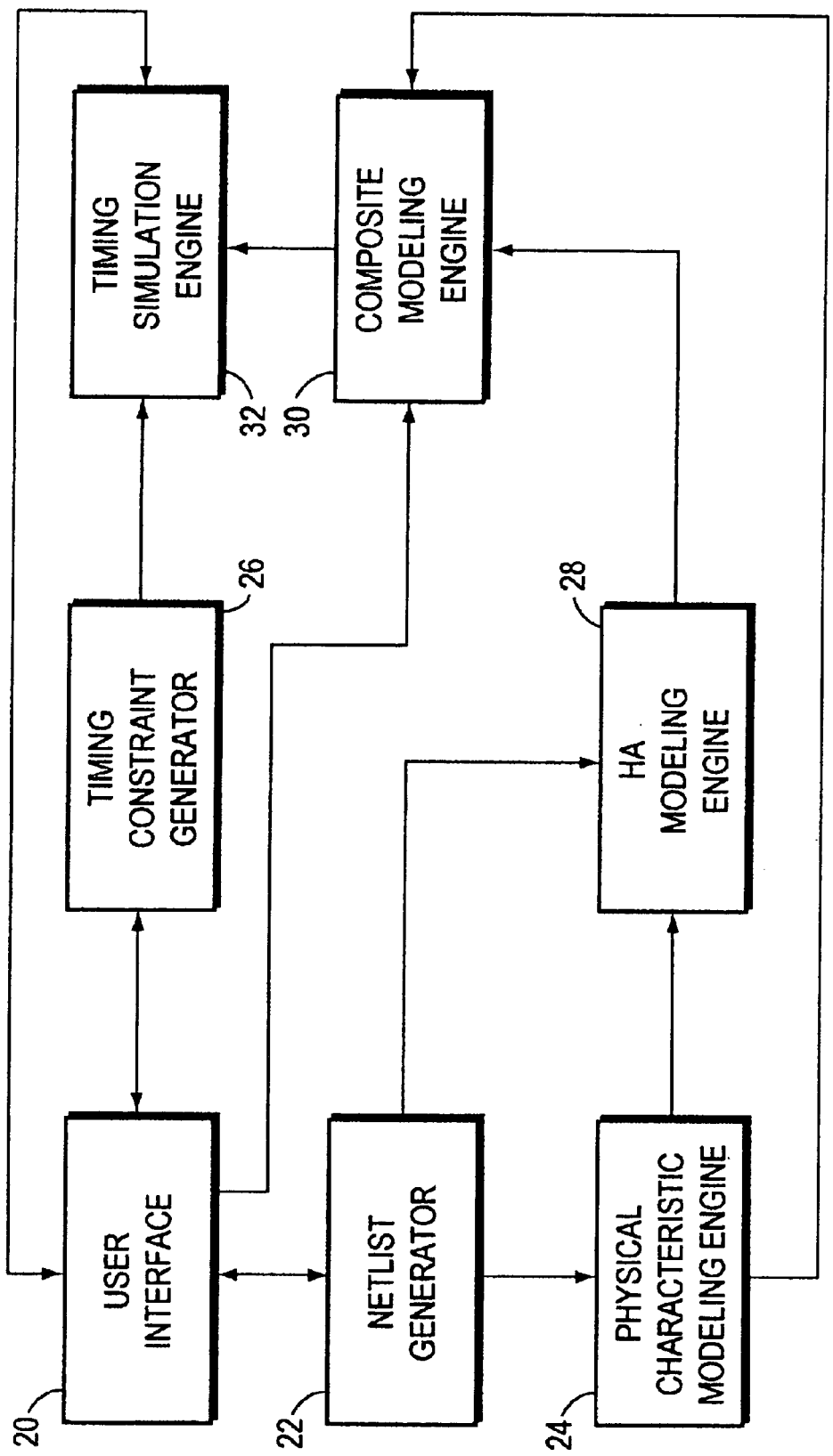
FIG. 1 is a highly schematic, functional block diagram of a modeling and simulation system wherein one embodiment of the present invention is advantageously practiced.
Figure 6:
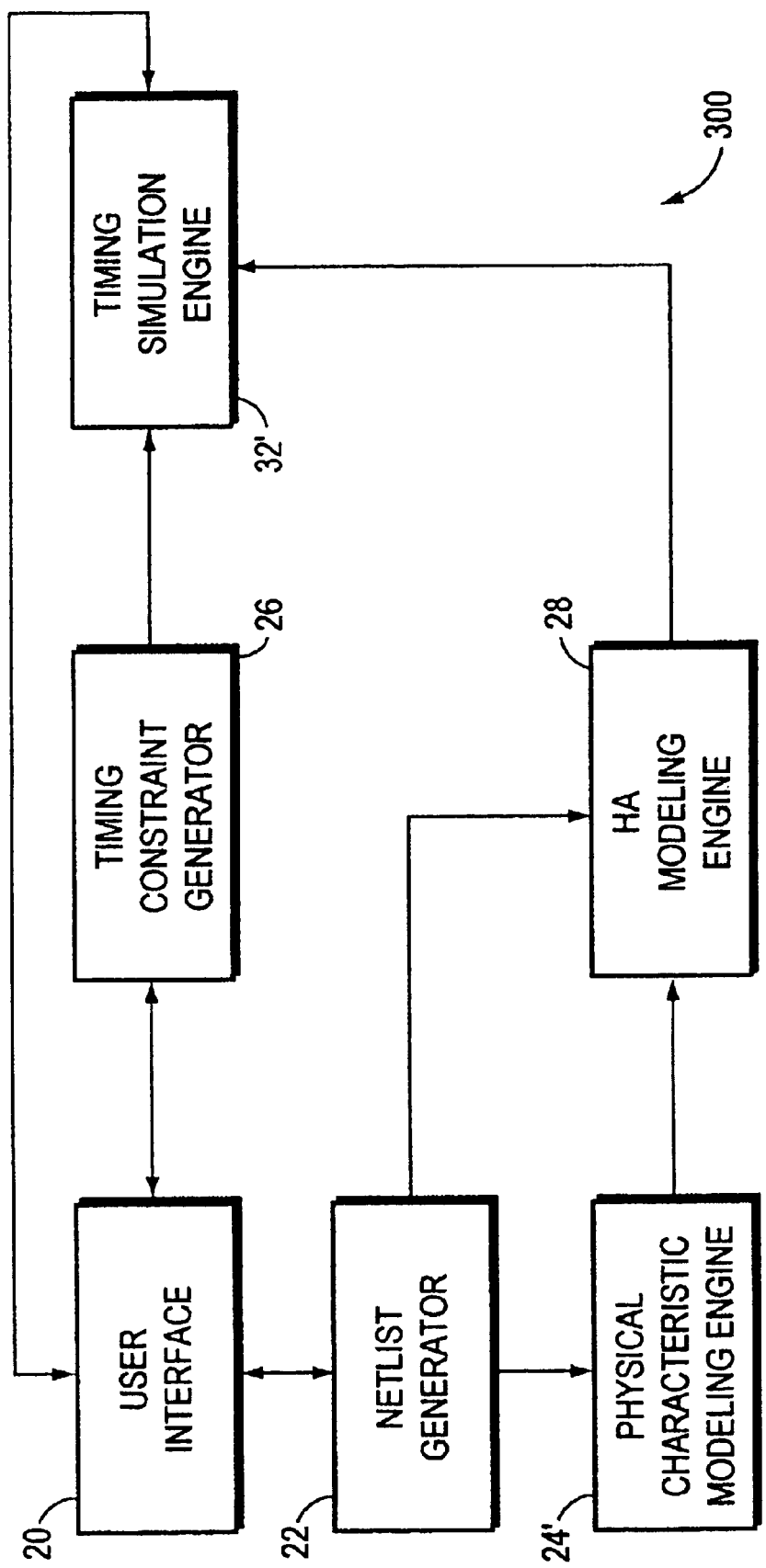
FIG. 6 is a highly schematic, functional block diagram of a conventional HA modeling and simulation system.

FIG. 1 illustrates a system 10 wherein one embodiment of the technique of the present invention for modeling and simulating timing operation of a proposed electronic system design 100 is advantageously practiced. FIG. 6 illustrates a conventional system 300 for modeling and simulating timing operation of design 100 using only conventional HA models. Although not shown in the Figures, systems 10 and 300 each comprise computer-readable memory (e.g., random access, read only and/or mass storage computer memory) for storing software programs and associated data structures for execution by one or more processors also comprised in the respective systems 10, 300. When executed by the one or more processors respectively comprised in systems 10, 300, the software programs and data structures cause the respective systems 10, 300 to carry out and/or implement the respective techniques, functions, and operations described herein as being carried out and/or implemented by the respective systems 10, 300 and their respective functional blocks (i.e., blocks 20, 22, 24, 26, 28, 30, 32 in system 10, and blocks 20, 22, 24', 26, 28, and 32' in system 300, respectively). As will be apparent to those skilled in the art, many types of computer processors and memories may be used in system 10 without departing from the present invention.

Figure 3:
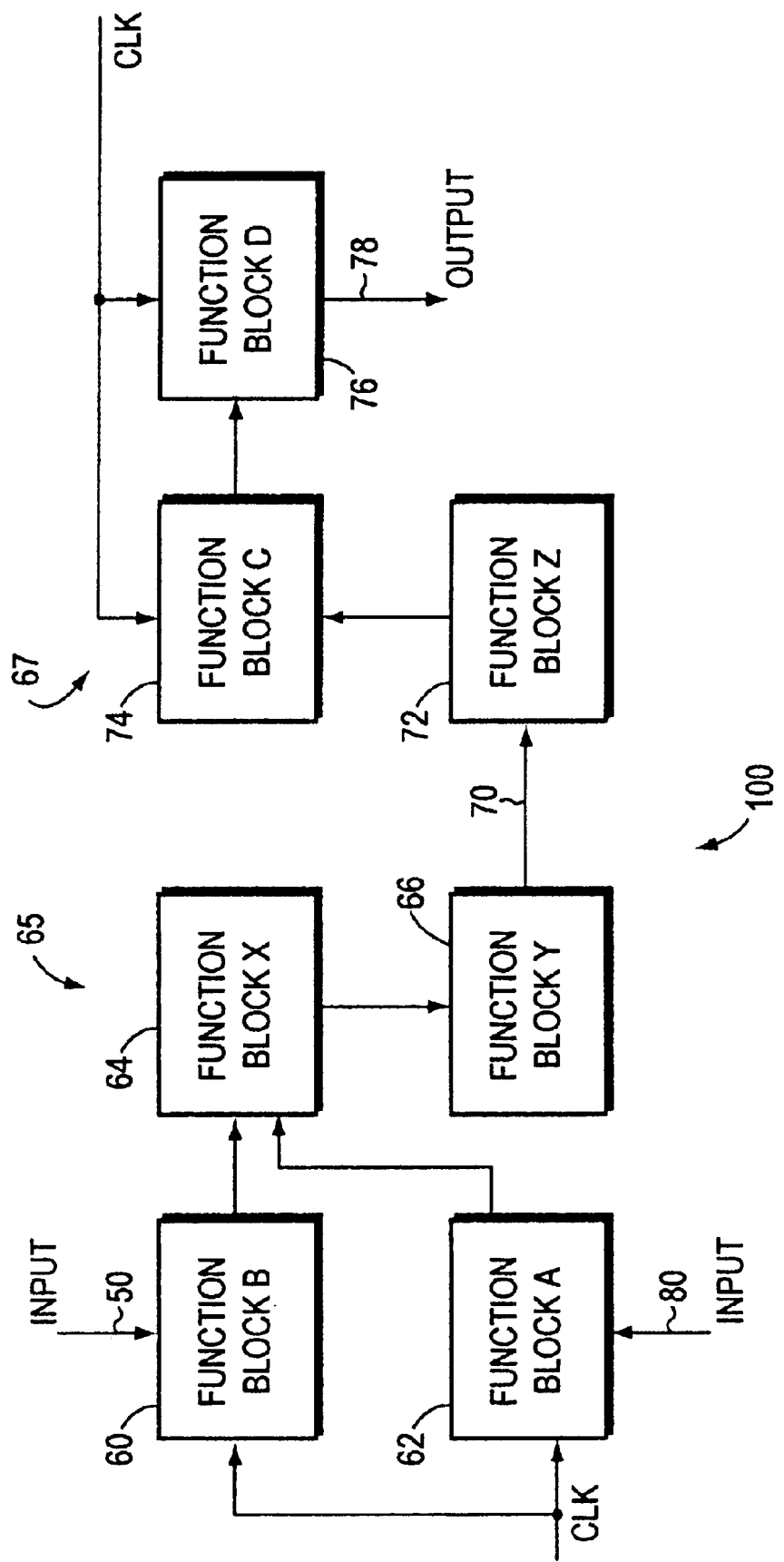
FIG. 3 is a highly schematic block diagram of an electronic system design that the system of FIG. 1 may be used to model.

By way of example, for purposes of illustrating the operation of the system 10, and with reference being made to FIG. 3, the proposed design 100 may be part of a parallel processor system of the type described in the aforesaid copending patent applications, and may include a plurality of functional modules or blocks (i.e., function blocks A, B, C, D, X, Y, and Z) 60, 62, 64, 66, 72, 74, 76 that interact with each other and generate outputs 78 based upon inputs 50, 80 and timing (i.e., clock) signals CLK. The blocks 60, 62, 64, and 66 may together comprise one logical circuit module 65 that produces outputs, and transmits the outputs via electrical connection (e.g., intermodule connection) 70 to another logical circuit module 67 comprising blocks 72, 74, 76. The module 67 may use the outputs provided to it from the module 65 to generate output signals that are supplied to other circuit elements (not shown) external to the design 100.

By way of illustration, the circuitry of module 65 may be comprised in one of the processor complexes of a parallel processor of the type described in the aforesaid copending applications, and the circuitry of the other module 67 may be comprised in another processor complex of the parallel processor. The circuitry of the two modules 65, 67 may be connected together via an intercomplex network connection 70 that permits data from the one of the processor complexes 65 to be provided to the other processor complex 67.

One or more of the function blocks (i.e., function blocks A, B) 60, 62 of module 65 may comprise sequential logic circuits that may receive inputs 50, 80 from sources not shown) external to the design 100 and externally-generated clock signals CLK. The blocks 60, 62 may generate and supply outputs based upon the inputs 50, 80 and clock signals CLK to downstream function block (i.e., function block X) 64 of the module 65. Downstream block 64 may comprise combinatorial logic circuitry that further processes the outputs supplied to it by the block 60 to generate outputs that are supplied to the function block 66 (i.e., function block Y). Block 66 may comprise driver circuitry that drives the signals supplied to it from the block 64 onto connection 70 for reception by function block 72 (i.e., function block Z) of the other module 67. Block 72 may comprise receiver circuitry that processes the signals it receives from module 65 for use by function block 74 (i.e., function block C). Function block 74 may comprise sequential logic circuitry that processes the signals it receives from the block 72 based upon external signals CLK to produce outputs that are supplied to another sequential logic circuitry block (i.e., function block D) 76. Block 76 processes the signals that it receives from block 74 based upon clock signals 76 to produce outputs 78. Function blocks 60, 62, 64 (i.e., function blocks A, B, X) typically may be much larger than function block 66 (i.e., function block Y).

Figure 2:
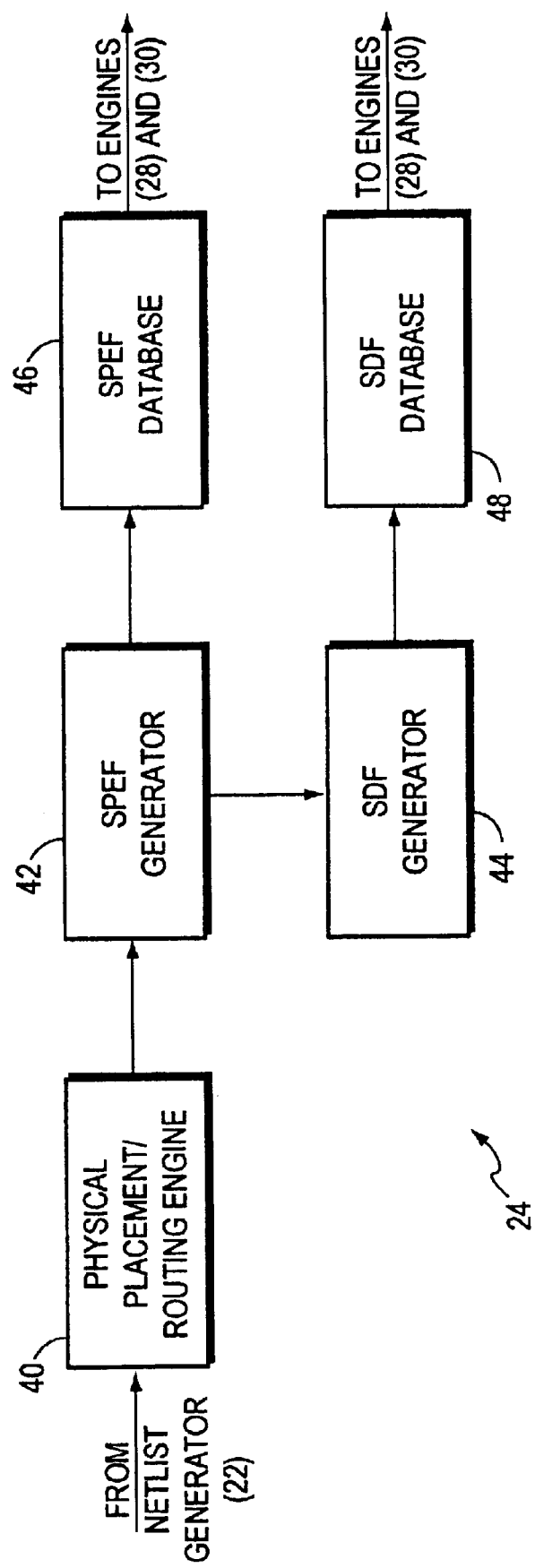
FIG. 2 is a highly schematic, functional block diagram of the physical characteristic modeling engine in the system of FIG. 1.

Turning now to FIGS. 1 and 2, system 10 comprises a graphical user interface 20 that permits the user to graphically and/or textually input specifications of the proposed design 100. If textually-based, these specifications may be input directly by the user in the form of Verilog™ and/or Very High Level Hardware Descriptor (VHDL)-compatible statements (i.e., statements that may be compiled using conventional techniques into a Verilog™ and/or VHDL netlist description of the design 100). If graphically-based, these specifications may be input by the user in the form of graphical symbols and the like which may be converted by the interface 20 into Verilog™ and/or VHDL-compatible statements.

Regardless of whether they are input directly by the user in the form of Verilog™ and/or VHDL-compatible statements, or converted thereto by the interface 20, the statements are compiled by conventional netlist generator 22 into a complete Verilog™ and/or VHDL netlist description of the design 100. The netlist description generated by the generator 22 may be displayed by the user interface 20 for review and/or editing by the user via the interface 20. The netlist description is then provided by the generator 22 to physical characteristic modeling engine 24.

Using conventional techniques, engine 24 generates from the netlist description, physical data that provides a physically-accurate description of the design 100. More specifically, with reference to FIG. 2, using conventional techniques, the physical placement/routing engine 40 of physical modeling engine 24 determines from the netlist description and predetermined physical design rules (e.g., preprogrammed into the engine 40 and/or provided by the user), the physical placement, compositions, construction, and layout of the design's circuit paths and electronic components (hereinafter referred to collectively as the design's "physical layout") of the design 100. Using conventional techniques, the SPEF data generator 42 of engine 24 then computes from the design's physical layout the relevant physical characteristics (e.g., input and output impedances, capacitances, etc.) of all of the components, circuit traces, electrical connection lines, etc. of the design 100, based upon well-known physical laws that correlate these physical characteristics to the design's physical layout. Data indicative of these relevant physical characteristics may be generated by the generator 42 and stored in the database 46 in an industry standard data format (e.g., the Standard Parasitic Exchange Format, "SPEF"). Using conventional techniques and well-known physical laws, the SDF generator 44 in engine 24 then generates from the relevant physical characteristics the estimated signal propagation delays for signals transmitted through at least certain components, circuit traces, electrical connection lines in the design 100. Data indicative of these estimated propagation delays may be generated by the generator 44 and stored in the database 48 in an industry standard data format (e.g., the Standard Delay Format, "SDF").

In system 10, the SPEF and SDF data stored in databases 46, 48, respectively, of engine 24 are made available to both conventional HA modeling engine 28 and composite modeling engine 30. Conversely, in system 300, the engine 24' provides the data in databases 46, 48 to only engine 28, but otherwise operates in a manner that is substantially identical to engine 24 of system 10. Using conventional techniques, the HA modeling engine 28 uses the SPEF and SDF data, and the netlist description of the design 100 to generate an HA model 150 of the design 100. This HA model 150 is schematically illustrated in FIG. 4.

Figure 4:
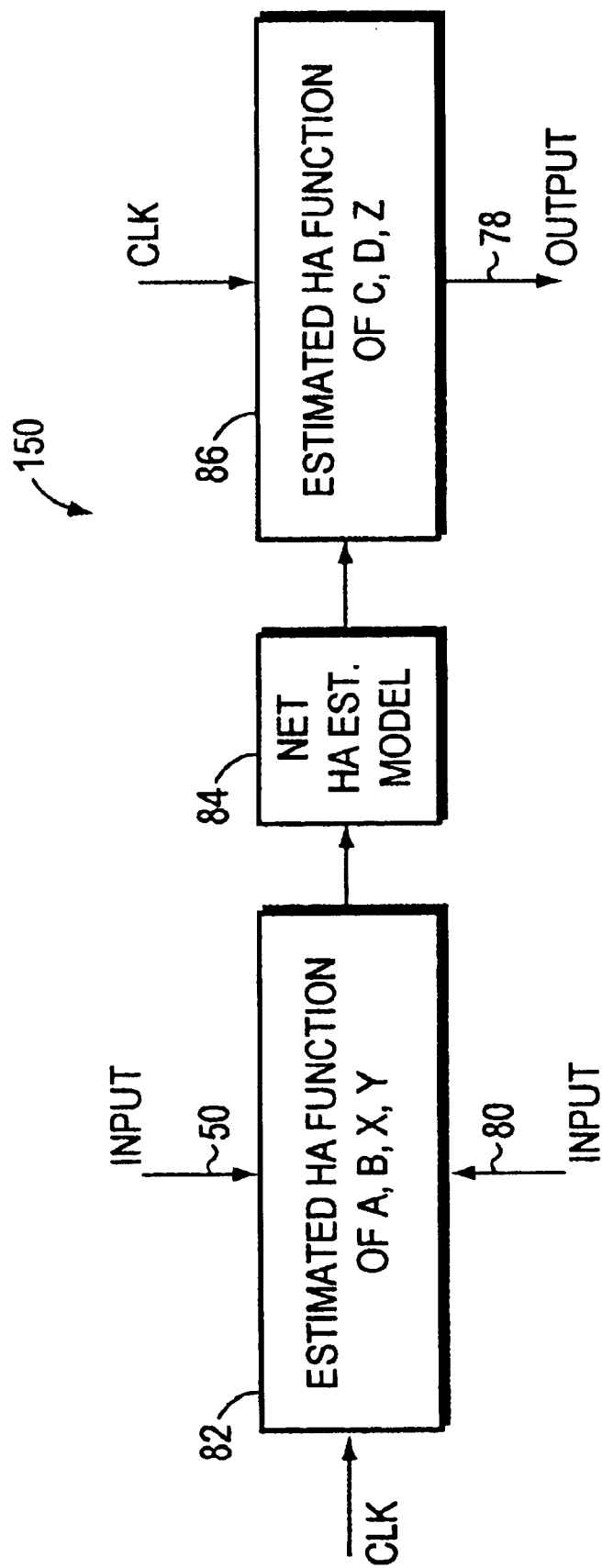
FIG. 4 is a highly schematic block diagram illustrating modeling of the design of FIG. 3 according to a conventional HA technique.

As shown schematically in FIG. 4, in the HA model 150 of design 100, functions 82, 84, and 86 are used. In essence, functions 82, 84, 86 are mathematical functional abstractions, based upon the physical characteristics of the proposed design 100 in the databases 46, 48, that may be used to estimate the overall timing operations of module 65, connection 70, and module 67, respectively, as a functions of the inputs 50, 80 and clock signals CLK provided thereto. More specifically, function 82 essentially is an approximate mathematical model of the overall timing operation of the module 65 that is based upon, but is not itself, an accurate description of the physical characteristics of the circuits, networks, etc. comprised in module 65 or blocks 60, 62, 64, and 66 comprised in module 65. Similarly, function 84 essentially is an approximate mathematical model of the overall timing operation of the connection 70 that is based upon, but is not itself, an accurate description of the physical characteristics of the connection 70. Also similarly, function 86 essentially is an approximate mathematical model of the overall timing operation of the module 67 that is based upon, but is not itself, an accurate description of the physical characteristics of the circuits, networks, etc. comprised in module 67 or blocks 72, 74, 76, comprised in module 67.

Before completing the description of system 10, we briefly return to describing the prior system 300, in order to point out the differences between system 10 and the prior art system 300. In prior art system 300 illustrated in FIG. 6, the HA model 150 generated by engine 28 is supplied to a timing simulation engine 32', which simulates the timing operation of the design 100 based upon the HA model 150 and timing constraint commands supplied to engine 32' from the timing constraint generator 26. More specifically, the user may input and edit various timing constraints (e.g., the timing of clock signals CLK, the input signals 50, 80 to be provided to the module 65, any expected variability in such signals, length of the simulation time, etc.) via the interface 20. These constraints may be provided to the generator 26, which generates therefrom corresponding timing constraint commands. These commands are provided to the engine 32, which uses them, together with the HA model 150 provided by the engine 28, to calculate, using conventional techniques, the simulated timing operation of the design 100 (e.g., the timing and waveform characteristics of the output signals 78 and respective signals propagating into and exiting connection 70, in relation to the timing and waveform characteristics of the clock signals CLK and input signals 50, 80). The results of these calculations may be provided to interface 20 which may graphically display them for analysis by the user.

The simulation generated by the engine 32' inherently includes approximation error, since it is based upon the approximate mathematical models 82, 84, 86 of the HA model 150. This makes the timing operation simulation generated by the engine 32' inherently less accurate than a corresponding timing operation simulation that is based upon actual physical characteristics of the design 100, rather than approximate models 82, 84, 86. Disadvantageously, in complex designs, the approximation error introduced into the HA-based simulation generated by the engine 32' may make it necessary to adjust the simulation so that it is based upon "worst case analysis" of the type discussed previously.

As shown in FIG. 1, in contrast to the conventional system of FIG. 6, in system 10, the HA model 150 generated by the engine 28 is supplied to the composite modeling engine 30, along with the SPEF and SDF data from the databases 46 and 48, and optionally, user-specified parameters provided by the user via interface 20. The parameters may specify, e.g., a portion of the design 100 (i.e., the function blocks and/or network connections) that is to be modeled using physical characteristics instead of HA models. Alternatively, the engine 30 may implement a process that uses empirically-determined hybrid modeling rules to select the portion or portions of the design 100 that are to be modeled by engine 30 using their physical characteristics rather then HA functions. The engine 30 modifies the HA model 150 generated by the engine 28 in accordance with the parameters, if provided by the user, or the process, and physical characteristics to generate a hybrid HA/physical characteristics-based model (e.g., model 200 illustrated schematically in FIG. 5). This hybrid model 200 is provided to the timing simulation engine 32 which uses this model 200, instead of the HA model 150, and the timing constraint commands provided by generator 26 to calculate the simulated timing operation of the design 100. The results of these calculations may be provided to interface 20 which may graphically display them for analysis by the user.

Figure 5:
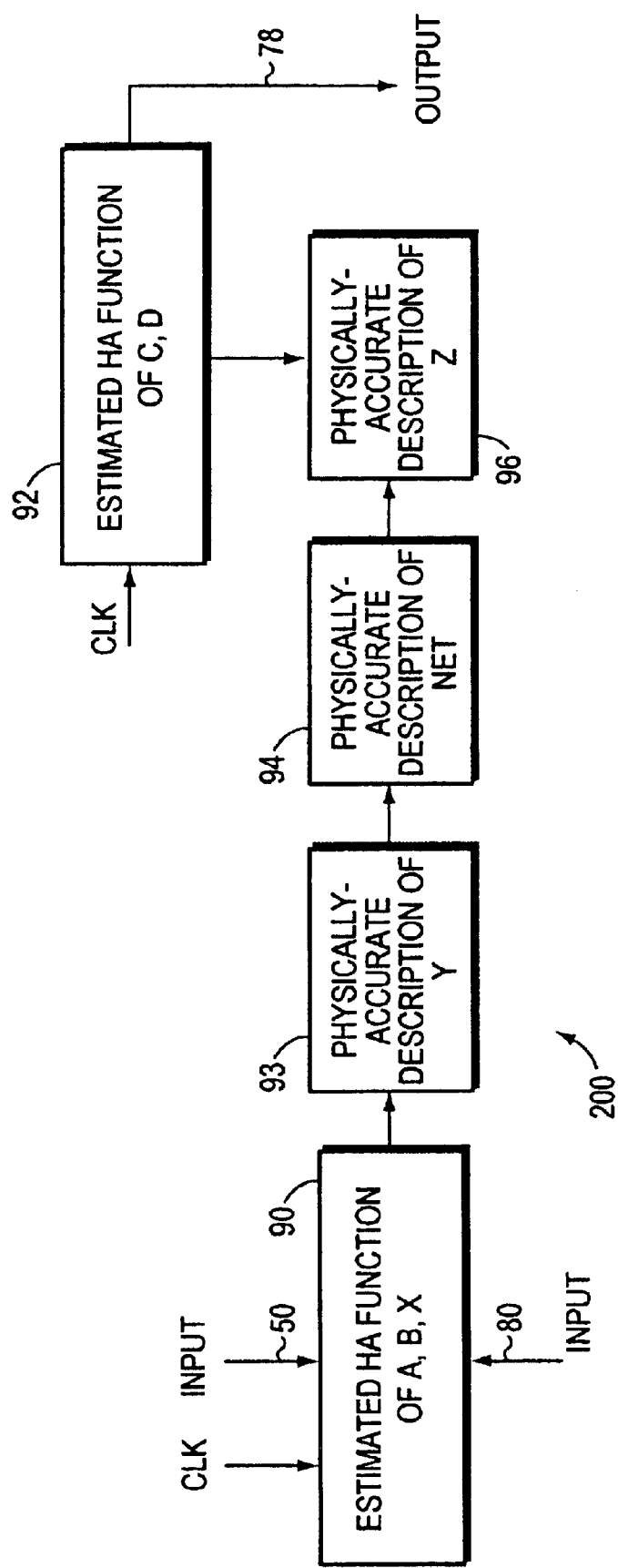
FIG. 5 is a highly schematic block diagram illustrating modeling of the electronic system of FIG. 3 in accordance with one embodiment of the present invention.

More specifically, as shown in FIG. 5, hybrid model 200 includes both estimated HA functions 90, 92 of portions of the design 100, and physically-accurate descriptions 93, 94, 96 (i.e., actual physical characteristics) of other portions of the design 100. That is, function 90 is an HA-based estimated function of the overall timing operation of the blocks 60, 62, 64 of the module 65. Function 92 is an HA-based estimated function of the overall timing operation of the blocks 74, 76 of the module 67. In hybrid model 200, the actual physical characteristics (e.g., as stored in the SPEF and SDF databases 46, 48) of the block 66, network connection 70, and block 72 are used along with these functions 90, 92 to permit the timing operation of the design 100 to be simulated more accurately than is possible when such simulation is based upon HA-based model 150.

That is, in simulating the timing operation of the design 100, in addition to using the timing constraint commands provided by the generator 26, the engine 32 uses the HA function 90 to estimate the overall timing operation of the portion of the module 65 that comprises blocks 60, 62, 64. Similarly, the engine 32 uses the HA function 92 to estimate the overall timing operation of the portion of the module 67 that comprises blocks 74 and 76. However, the engine 32 calculates the respective timing operations of block 66, connection 70, and block 76 using the respective actual physically characteristics 93, 94, 96 of these components 66, 70, 76. In order to calculate the overall timing operation of the design 100, the timing operations calculated using the functions 90, 92, and descriptions 93, 94, 96 may be combined.

As noted above, the portions 66, 70, 72 of the design 100 that are modeled in model 200 using their actual physical characteristics may be selected in accordance with parameters supplied to the engine 30 from the user via the interface 20, or by a selection process implemented by the engine 30. If the parameters are appropriately selected by the user, the competing interests of minimizing the simulation's approximation error and required processing overhead may be optimally balanced. That is, by appropriately selecting parameters, the simulation's approximation error may be reduced to below a desired threshold, without unduly increasing the amount of processing overhead needed to generate the simulation to an undesirable level.

Alternatively, the engine 30 may implement a process that optimally selects the portion of the design 100 that is to be modeled using physical characteristics instead of HA functions. According to this process, the portion of design 100 that is to be modeled using physical characteristics is selected based upon empirically-determined simulation optimization rules that have been determined to maximize possibility of increasing accuracy of the simulation without unduly increasing the processing overhead required to generate the simulation. For example, as is often the case in designs such as design 100 that comprise an intermodule cross-chip connection 70, it has been empirically determined that optimal results in terms of maximizing accuracy of the simulation without unduly increasing the processing overhead required for the simulation tend to occur when the physical characteristics of connection 70 and function blocks (e.g., blocks 66 and 72) that are directly connected to the connection 70 are simulated using their physical characteristics instead of HA functions. Based upon this empirically-determined rule, the engine 30 may modify the model 150 by essentially "repartitioning" the boundaries of the HA functions such that blocks 60, 62, 64 in one module 65 that are not directly connected to the connection 70 are modeled using one HA function 90, blocks 74, 76 that are in the other module 67 and are also not directly connected to connection 70 are modeled using another HA function 92, and the blocks 93, 96 that are connected to connection 70, and connection 70 itself, are modeled using their physical characteristics 93, 94, 96. As will be appreciated, engine 30 may be programmed with additional empirically-determined optimization rules for optimally modifying other designs in accordance with this process.

Thus, it is evident that there has been provided, in accordance with the present invention, an electronic system modeling technique that fully satisfies the aims and objectives, and achieves the advantages set forth above. As will be apparent to those skilled in the art, many alternatives, modifications, and variations of the embodiments described above are possible. For example, although the functional blocks 20, 22, 24, 24', 26, 28, 32, 32' shown in FIGS. 1 and 6 may be implemented by conventional static timing, design compilation, physical design software, and/or related processes executed by software programs of the type that are commercially available from Synopsys, Inc. of Mountain View, Calif. and other vendors (e.g., the PrimeTime™ and/or related software programs), other software programs may be used without departing from the present invention.

What is claimed is:

1. A computerized method for use in simulating an operation of an electronic system, said method being carried out using a computer system, said method comprising the steps of:

generating a physically-accurate description of the timing of a first portion of said system, said physically-accurate description comprising actual physical characteristics of said first portion;

generating an approximate mathematical model of the timing of a remaining portion of said system, said model being based upon hierarchical analysis of said remaining portion; and using both said physically-accurate description and said approximate model to simulate the timing operation of said system.

2. A method according to claim 1, wherein:
said first portion and said remaining portion are selected according simulation optimization rules.

3. A method according to claim 1, wherein:
said first and remaining portions are selected so as to optimally reduce simulation error.

4. A computerized system for use in simulating an operation of an electronic system, comprising the steps of:
a modeling engine that modifies a first model of said electronic system, said first model including only hierarchical analysis mathematical functions estimating timing operation of said electronic system, said modeling engine modifying said first model to include both at least one hierarchical analysis mathematical function estimating timing operation of a portion of said electronic system and a physically-accurate description of another portion of said electronic system; and
a simulation engine that simulates the timing operation of said electronic system based upon both said at least one function and said physically-accurate description.

5. A computerized system according to claim 4, wherein:
said portions are selected so as to optimally reduce simulation error.

6. A computerized system according to claim 4, wherein:
said portions are selected based upon simulation optimization rules.

7. A computer-readable memory containing computer-executable program instructions comprising instructions for:
generating a physically-accurate description of the timing of a first portion of an electronic system, said physically-accurate description comprising actual physical characteristics of said first portion;
generating an approximate mathematical model of the timing of a remaining portion of said system, said model being based upon hierarchical analysis of said remaining portion; and
simulating timing operation of said system using both said description and said model.

8. A computer-readable memory according to claim 7, wherein:
said portions are selected to optimally reduce simulation error.

9. A computer-readable memory according to claim 7, wherein:
said first portion and said remaining portion are selected according to simulation optimization rules.

10. A computerized method for use in simulating an operation of an electronic system, said method being carried out using a computer system, said method comprising the steps of:
dividing a representation of a system presented on a user interface into a first portion of said system and a second portion of said system;
generating, in response to said dividing, a physically-accurate description of said first portion of said system, said physically-accurate description comprising actual physical characteristics of said first portion;
generating, in response to said dividing, an approximate mathematical model of said second portion of said system, said model being based upon hierarchical analysis of said remaining portion; and
using both said physically-accurate description and said approximate model to simulate the operation of said system.

11. A computerized system for use in simulating an operation of an electronic system, comprising:
a user interface to divide said system into a first part and a second part;
a modeling engine, responsive to dividing said system into said first part and said second part, that first models said first part of said system by a physically accurate description of said first part of said electronic system to produce a first model, said modeling engine secondly developing a second model of said second part of said electronic system by including only hierarchical analysis approximate mathematical functions estimating operation of said second part of said electronic system; and
a simulation engine that simulates the operation of said electronic system based upon both said first model of said physically accurate description and said second model of said hierarchical analysis approximate mathematical functions.

12. A computer-readable memory containing computer-executable program instructions comprising instructions for:
dividing a representation of a system presented on a user interface into a first portion of said system and a second portion of said system;
generating, in response to said dividing, a physically-accurate description of said first portion of said system, said physically-accurate description comprising actual physical characteristics of said first portion;
generating, in response to said dividing, an approximate mathematical model of said second portion of said system, said model being based upon hierarchical analysis of said remaining portion; and
using both said physically-accurate description and said approximate model to simulate the operation of said system.

13. A computerized system for use in simulating an operation of an electronic system, comprising:
means for generating a physically-accurate description of a first portion of said system, said physically-accurate description comprising actual physical characteristics of said first portion;
means for generating an approximate mathematical model of a remaining portion of said system, said model being based upon hierarchical analysis of said remaining portion; and
means for using both said physically-accurate description and said approximate model to simulate the operation of said system.

14. A computerized system for use in simulating an operation of an electronic system, comprising:
means for dividing a representation of a system presented on a user interface into a first portion of said system and a second portion of said system;
means for generating, in response to said dividing, a physically-accurate description of said first portion of said system, said physically-accurate description comprising actual physical characteristics of said first portion;
means for generating, in response to said dividing, an approximate mathematical model of said second portion of said system, said model being based upon hierarchical analysis of said remaining portion; and
means for using both said physically-accurate description and said approximate model to simulate the operation of said system.

* * * * *